US010553575B2

(12) United States Patent
Tien et al.

(10) Patent No.: US 10,553,575 B2
(45) Date of Patent: Feb. 4, 2020

(54) SEMICONDUCTOR DEVICE HAVING ENGINEERING CHANGE ORDER (ECO) CELLS AND METHOD OF USING

(71) Applicant: TAIWAN SEMICONDUCTOR MANUFACTURING COMPANY, LTD., Hsinchu (TW)

(72) Inventors: Li-Chun Tien, Tainan (TW); Ya-Chi Chou, Hsinchu (TW); Hui-Zhong Zhuang, Kaohisung (TW); Chun-Fu Chen, Chiayi (TW); Ting-Wei Chen, New Taipei (TW); Hsiang Jen Tseng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/815,289

(22) Filed: Nov. 16, 2017

(65) Prior Publication Data

US 2018/0076190 A1    Mar. 15, 2018

Related U.S. Application Data

(62) Division of application No. 13/965,648, filed on Aug. 13, 2013, now Pat. No. 9,831,230.

(51) Int. Cl.
*H01L 27/02* (2006.01)
*H01L 27/118* (2006.01)
*G06F 17/50* (2006.01)

(52) U.S. Cl.
CPC ...... *H01L 27/0207* (2013.01); *G06F 17/5068* (2013.01); *H01L 27/11807* (2013.01); *H01L 2027/11875* (2013.01)

(58) Field of Classification Search
CPC .......... H01L 27/0207; H01L 27/11807; H01L 2027/11875; G06F 17/5068
See application file for complete search history.

(56) References Cited

U.S. PATENT DOCUMENTS

| 9,021,405 B2 * | 4/2015 | Hiramoto | .......... H01L 27/11807 430/30 |
| 9,099,447 B2 | 8/2015 | Tamaru | |

(Continued)

FOREIGN PATENT DOCUMENTS

CN    101743633    6/2010

OTHER PUBLICATIONS

Office Action dated Nov. 2, 2016 from corresponding application No. CN 201310535364.5.

*Primary Examiner* — Nha T Nguyen
(74) *Attorney, Agent, or Firm* — Hauptman Ham, LLP

(57) ABSTRACT

A semiconductor device includes an array of Engineering Change Order (ECO) cells. Each of the ECO cells in the array includes a first metal pattern and a second metal pattern. Each of the ECO cells in the array further includes a plurality of active area patterns isolated from each other and arranged between the first and second metal patterns. Each of the ECO cells in the array further includes a first central metal pattern overlapping the first metal pattern. Each of the ECO cells in the array further includes a via electrically connecting the first central metal pattern to the first metal pattern. The plurality of active area patterns is arranged symmetrically about the first central metal pattern.

20 Claims, 10 Drawing Sheets

(56) References Cited

U.S. PATENT DOCUMENTS

2010/0155783 A1* 6/2010 Law ............... H01L 27/0207
                                                257/206
2010/0187699 A1   7/2010 Nishimura et al.
2010/0258798 A1* 10/2010 Sokel ............... H01L 22/34
                                                 257/48
2012/0131533 A1   5/2012 Marinet
2013/0069169 A1*  3/2013 Kwon .............. H01L 27/0207
                                                257/401

* cited by examiner

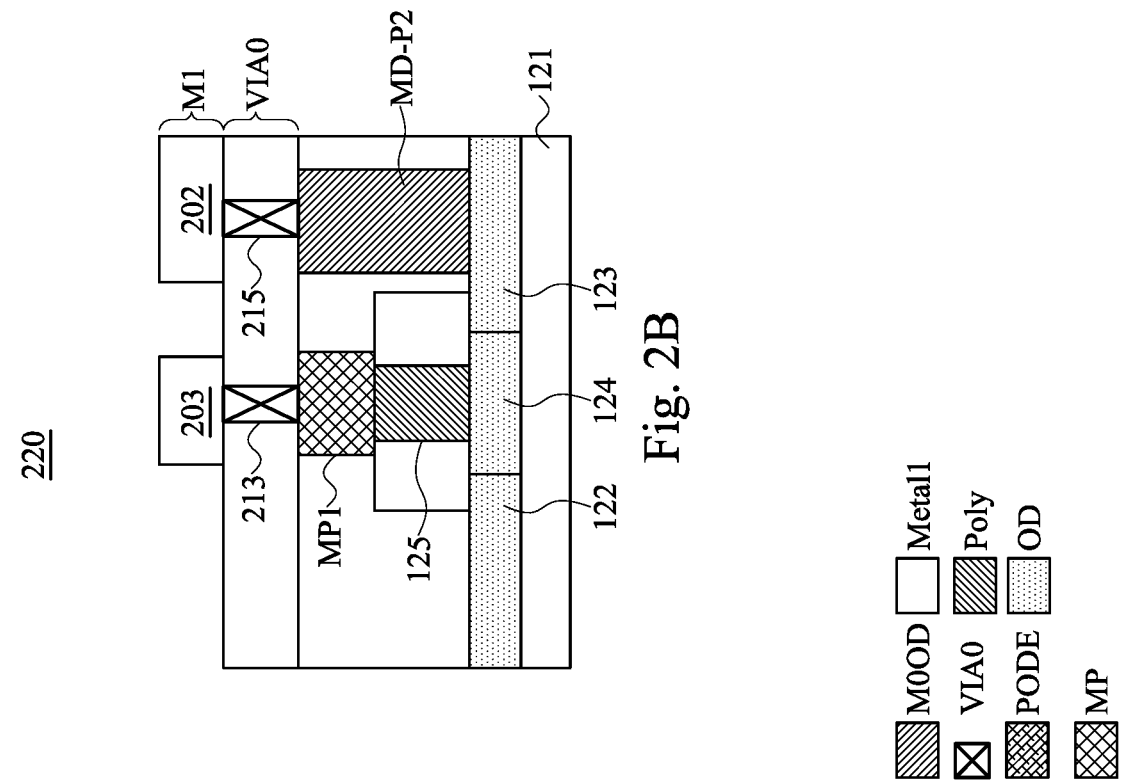
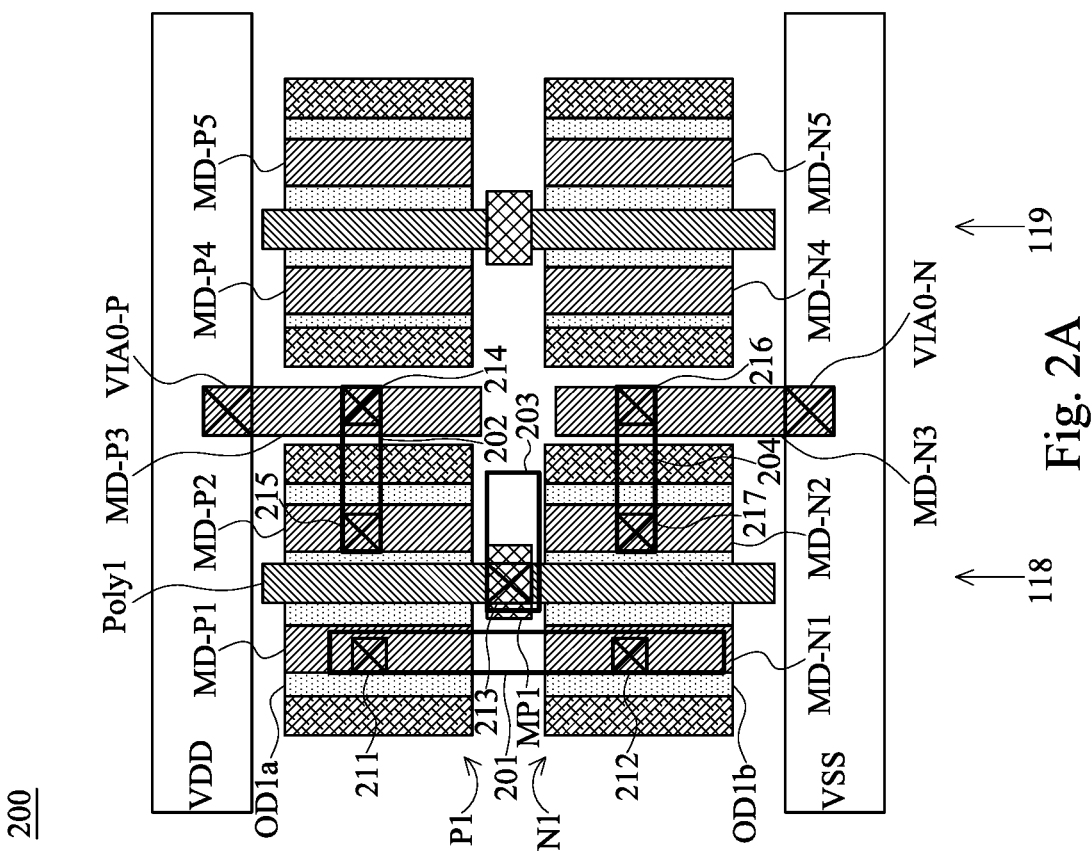
Fig. 2B
Fig. 2A

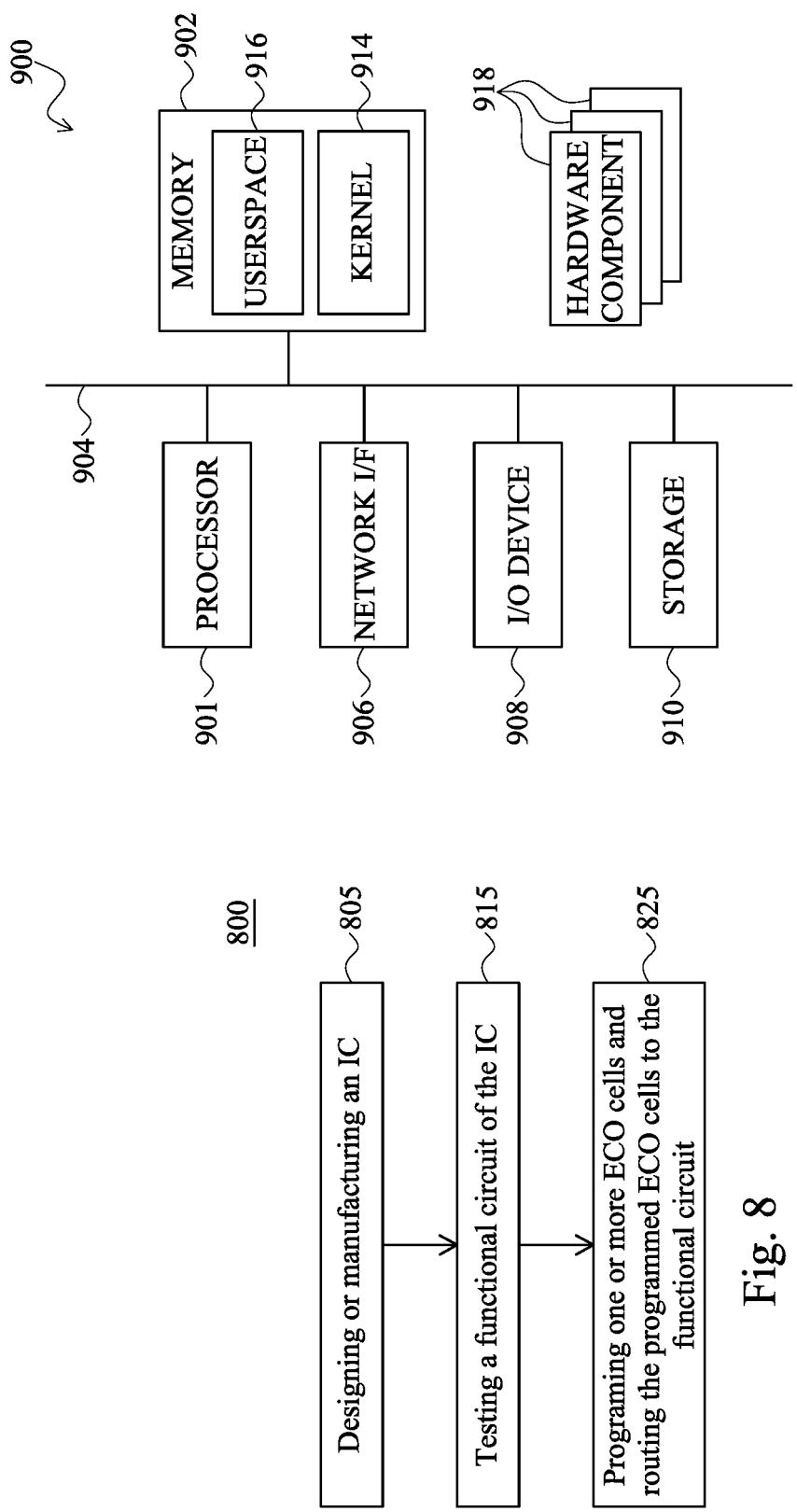

US 10,553,575 B2

SEMICONDUCTOR DEVICE HAVING ENGINEERING CHANGE ORDER (ECO) CELLS AND METHOD OF USING

PRIORITY CLAIM

The present application is a divisional of U.S. application Ser. No. 13/965,648, filed Aug. 13, 2013, which is incorporated herein by reference in its entirety.

BACKGROUND

For designing and manufacturing integrated circuits (ICs), standard cells are used. Such standard cells have pre-designed layouts and are stored in standard cell libraries.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 2A is a layout of the ECO cell of FIG. 1A in a programmed state, in accordance with some embodiments.

FIG. 2B is a schematic cross-sectional view of a portion of a semiconductor structure of the ECO cell in the programmed state of FIG. 2A, in accordance with some embodiments.

FIG. 8 is a flow chart of a method of manufacturing a semiconductor device, in accordance with some embodiments.

FIG. 9 is a block diagram of a computer system, in accordance with some embodiments.

DETAILED DESCRIPTION

Figures 1A, 1B:
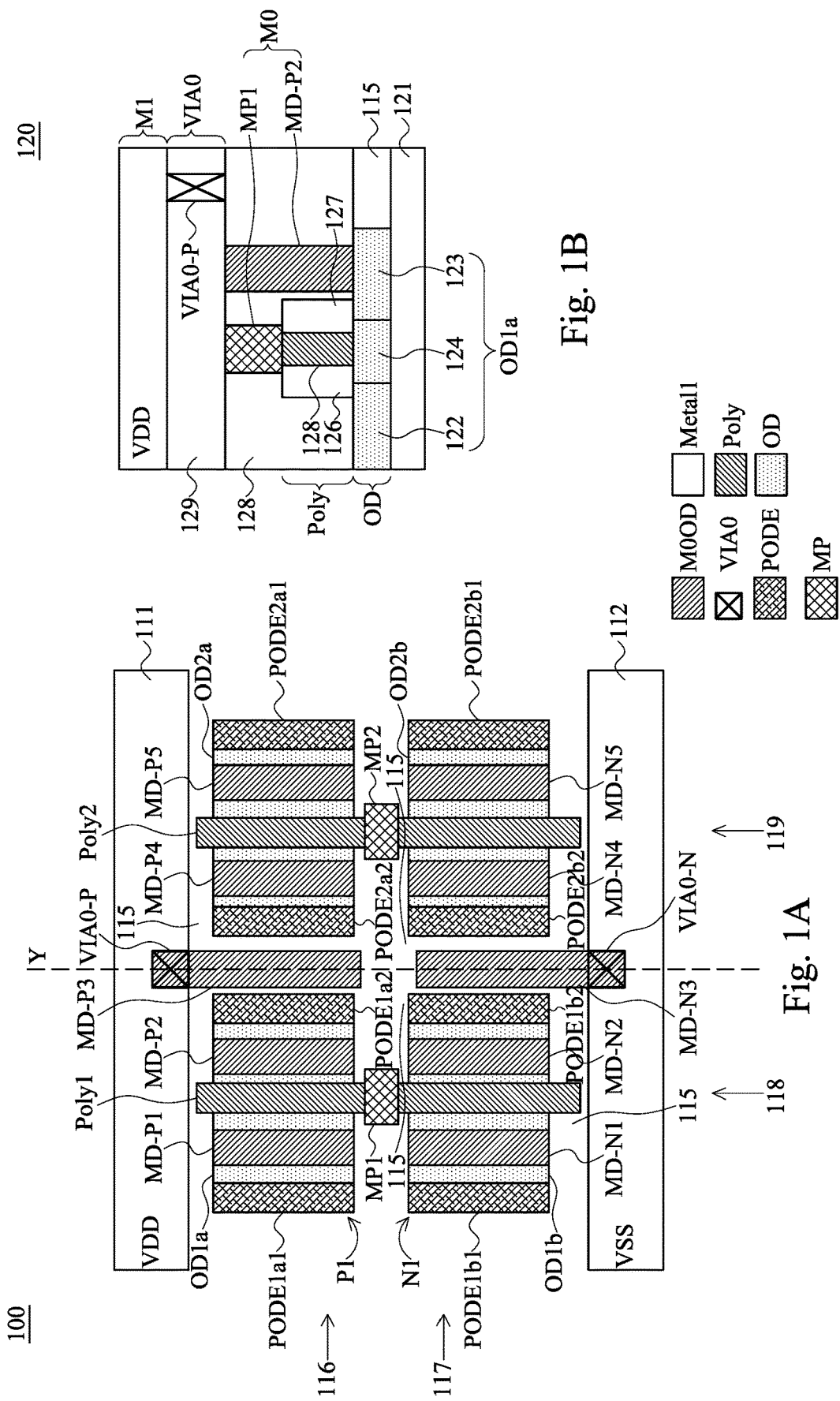
FIG. 1A is a layout of an ECO cell in an unprogrammed state, in accordance with some embodiments.
FIG. 1B is a schematic cross-sectional view of a portion of a semiconductor structure of the ECO cell in the unprogrammed state of FIG. 1A, in accordance with some embodiments.

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent, however, that one or more embodiments may be practiced without these specific details Like reference numerals in the drawings denote like elements.

Standard cells generally include functional cells and engineering change order (ECO) cells. A functional cell is pre-designed to have a specific function, e.g., a logic function. An ECO cell is pre-designed without a specific function, but is programmable to provide a specific function. To design an IC, the pre-designed layouts of one or more functional cells are read out from the standard cell libraries and placed into an initial IC layout. Routing is performed to connect the functional cells using one or more metal layers. The IC layout also includes one or more ECO cells which are not connected to the functional cells. When the IC layout is to be revised, one or more ECO cells are programmed to provide an intended function and routed to the functional cells. The programming of the ECO cells involves modifications in several layers of the IC layout and/or masks for manufacturing the IC.

In some embodiments, a layout of a standard cell includes a plurality of active area patterns distributed on opposite sides of a central conductive pattern. The active area patterns are further disposed between a power line and a ground line. The central conductive pattern overlaps at least one of the power line and the ground line. In at least one embodiment, the standard cell is an ECO cell which is programmable by providing electrical connections (i) among the active area patterns and/or (ii) from one or more of the active area patterns to the power line and/or the ground line via the central conductive pattern. The programming involves modifying one or more layers, such as a VIA0 layer, which is the lowermost via layer in an IC, and an M1 layer which is the metal layer immediately above and electrically connected to the VIA0 layer. In some embodiments, only the M1 layer is modified to complete the programming. Because only the M1 layer is modified in at least one embodiment, or only the VIA0 layer and the M1 layer are modified in at least one embodiment, for programming ECO cells, the designing and/or manufacturing cost and time are reduced compared to situations where one or more layers other than the VIA0 layer and the M1 layer are additionally modified for programming ECO cells.

FIG. 1A is a layout 100 of an ECO cell in an unprogrammed state, in accordance with some embodiments. The layout 100 includes a first conductive pattern 111, a second conductive pattern 112, a plurality of active area patterns OD1a, OD1b, OD2a, OD2b, a plurality of conductive patterns MD-P1, MD-P2, MD-P3, MD-P4, MD-P5, MD-N1, MD-N2, MD-N3, MD-N4, MD-N5, MP1, MP2, a first conductive gate pattern Poly1, a second conductive gate pattern Poly2, a plurality of auxiliary conductive patterns PODE1a1, PODE1a2, PODE2a1, PODE2a1, PODE1b1, PODE1b2, PODE2b1, PODE2b1, a first via VIA0-P, a second via VIA0-N, and one or more isolation structures 115.

In some embodiments, the first conductive pattern 111 is a power line VDD and the second conductive pattern 112 is a ground line VSS for supplying power and ground voltages to the ECO cell when the ECO cell is programmed.

The active area patterns OD1a, OD1b, OD2a and OD2b are commonly referred to herein as "OD patterns," i.e., oxide-definition (OD) patterns, and are schematically illustrated in the drawings with the label "OD." The OD patterns are configured to define active devices in the ECO cell. Examples of active devices include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or FinFETs, planar MOS transistors with raised source/drains.

The OD patterns are isolated from each other by the isolation structures 115. The OD patterns are arranged in a first row 116 and a second row 117 between the power line VDD and the ground line VSS. The first row 116 is adjacent the power line VDD and comprises the first active area pattern OD1a and the second active area pattern OD2a. The second row 117 is adjacent the ground line VSS and comprises the third active area pattern OD1b and the fourth active area pattern OD2b. In some embodiments, the first row 116 defines a P-region for forming p-channel metal-oxide semiconductor (PMOS) transistors in the first active area pattern OD1a and second active area pattern OD2a, and the second row 117 defines an N-region for forming n-channel metal-oxide semiconductor (NMOS) transistors in the third active area pattern OD1b and the fourth active area pattern OD2b. In at least one embodiment, the OD patterns are arranged symmetrically about a symmetrical axis Y of the ECO cell. Specifically, the first active area pattern OD1a is arranged symmetrically with respect to second active area pattern OD2a across the symmetrical axis Y, and the third active area pattern OD1b is arranged symmetrically with respect to the fourth active area pattern OD2b across the symmetrical axis Y. Examples of materials of the OD patterns include, but are not limited to, semiconductor materials doped with various types of p-dopants and/or n-dopants.

The first gate pattern Poly1 and the second gate pattern Poly2 are commonly referred to herein as "Poly patterns," and are schematically illustrated in the drawings with the label "Poly." The Poly patterns are formed over the OD patterns and are configured to define, together with the OD patterns, active devices in the ECO cell. In at least one embodiment, the Poly patterns define gates of transistors formed on the OD patterns. The first gate pattern Poly1 extends continuously over the first active area pattern OD1a and the third active area pattern OD1b, and across the isolation structure 115 between the first active area pattern OD1a and the third active area pattern OD1b. The second gate pattern Poly2 extends continuously over the second active area pattern OD2a and the fourth active area pattern OD2b, and across the isolation structure 115 between the second active area pattern OD2a and the fourth active area pattern OD2b. The number of Poly patterns over each OD pattern indicates the number of transistors formed in the OD pattern. For example, in FIG. 1A, there is one Poly pattern, i.e., the first gate pattern Poly1, over the first active area pattern OD1a which indicates that one transistor, e.g., a PMOS P1, is formed in the first active area pattern OD1a. Similarly, there is one Poly pattern, i.e., the first gate pattern Poly1, over the third active area pattern OD1b which indicates that one transistor, e.g., an NMOS N1, is formed in the third active area pattern OD1b. The PMOS P1 and NMOS N1 formed by the first active area pattern OD1a, the third active area pattern OD1b and the first gate pattern Poly1 together define a first 1P1N (i.e., one-PMOS-one-NMOS) structure 118. A second 1P1N structure 119 is formed by the second active area pattern OD2a, the fourth active area pattern OD2b and the second gate pattern Poly2 and is symmetric with respect to the first 1P1N structure across the symmetrical axis Y. The ECO cell as described has a dual 1P1N structure. In some embodiments, the number of Poly patterns over each OD pattern is not limited to one, and is any positive integer number. In such embodiments, the ECO cell has a dual xPxN structure, where "x" indicates the number of Poly patterns over each OD pattern. Examples of materials of the Poly patterns include, but are not limited to, metal and polysilicon.

The auxiliary conductive patterns PODE1a1, PODE1a2, PODE2a1, PODE2a1, PODE1b1, PODE1b2, PODE2b1 and PODE2b1 are commonly referred to herein as "PODE patterns," i.e., polysilicon-over-oxide-edge (PODE) patterns, and are schematically illustrated in the drawings with the label "PODE." The PODE patterns are formed over edges of the OD patterns. For example, the auxiliary conductive patterns PODE1a1 and PODE1a2 are formed over edges of the first active area pattern OD1a. In at least one embodiment, the PODE patterns do not constitute any functional feature of one or more active devices formed in the corresponding OD pattern. In some embodiments, the PODE patterns are formed of the same material, by using the same mask, as the Poly patterns. In such embodiments, the Poly patterns and the PODE patterns are formed in the same layer, referred to herein as "Poly layer."

The conductive patterns MD-P1, MD-P2, MD-P4, MD-P5, MD-N1, MD-N2, MD-N4, and MD-N5 are commonly referred to herein as "MD patterns" or "M0OD patterns," i.e., metal-zero-over-oxide (MD or M0OD) patterns, and are schematically illustrated in the drawings with the label "MD" or "M0OD." The MD patterns are formed over the OD patterns to define electrical connections from the active devices formed in the OD patterns to outside circuitry. The MD patterns are arranged alternatively with the Poly patterns formed over the same OD pattern. For x number of Poly patterns formed over each OD pattern, there is (x+1) MD patterns formed over the same OD pattern. For example, for one Poly pattern, i.e., the first gate pattern Poly1, formed over the first active area pattern OD1a, there are two MD patterns, i.e., the conductive patterns MD-P1 and MD-P2, formed over the first active area pattern OD1a on opposite sides of the first gate pattern Poly1. In at least one embodiment, the MD patterns are formed of metal and belong to a first metal layer, referred to herein as "M0 layer," i.e., metal-zero (M0) layer, which is the lowermost metal layer above the active devices of the ECO cell.

The conductive patterns MD-P3 and MD-N3 define a first central conductive pattern and a second central conductive pattern, respectively, and are commonly referred to herein as "central MD patterns." In at least one embodiment, the central MD patterns are aligned with each other along the symmetrical axis Y, and the OD patterns are arranged symmetrically on opposite sides of the central MD patterns. The central MD patterns are not formed over the OD patterns, but are referred to herein as MD patterns, because the central MD patterns are formed of the same material, by using the same mask, e.g., an "MD mask," as the other MD patterns. The first central conductive pattern MD-P3 overlaps the power line VDD and the second central conductive pattern MD-N3 overlaps the ground line VSS. The central MD patterns define electrical connections from the active devices of the programmed ECO cell to the power line VDD and ground line VSS. In FIG. 1A, the central MD patterns are shown as being above the power line VDD and the ground line VSS for convenience of illustration and description. In at least one embodiment, the central MD patterns are physically located below the power line VDD and the ground line VSS which are on a second metal layer. The second metal layer is a metal layer immediately above the M0 layer, is referred to herein as "M1 layer" or "Metal1 layer," and is schematically illustrated in the drawings with the label "Metal1" or "M1."

The first via VIA0-P electrically connects the first central conductive pattern MD-P3 to the power line VDD, and the second via VIA0-N electrically connects the second central conductive pattern MD-N3 to the ground line VSS. The first via VIA0-P and the second via VIA0-N belong to a VIA0 layer (schematically illustrated in the drawings with the label "VIA0") which is the lowermost via layer above the active devices of the ECO cell. The VIA0 layer is configured to provide via connections between the M0 layer and the M1 layer. In at least one embodiment, the first via VIA0-P and second via VIA0-N are omitted from the layout 100 of the ECO cell in the unprogrammed state, and are included when the ECO cell is programmed.

The conductive patterns MP1 and MP2 are commonly referred to herein as "MP patterns" or "M0OP patterns," i.e., metal-zero-over-polysilicon (MP or M0OP) patterns, and are schematically illustrated in the drawings with the label "MP." Each of the MP patterns is formed over and in electrical contact with a corresponding one of the Poly patterns. For example, the conductive pattern MP1 is formed over and in electrical contact with the first gate pattern Poly1, and the conductive pattern MP2 is formed over and in electrical contact with the second gate pattern Poly2. The MP patterns are formed over the isolation structure 115 between the first row 116 (i.e., the P-region) and the second row 117 (i.e., the N-region). The MP patterns define electrical connections from the Poly patterns in the active devices of the programmed ECO cell to outside circuitry. In at least one embodiment, the MP patterns are formed of metal and belong to the M0 layer.

In some embodiments, the Poly layer, the M0 layer, the VIA0 layer and the M1 layer of the ECO cell correspond to the Poly layer, the M0 layer, the VIA0 layer and the M1 layer of functional cells to be formed in the same IC.

Figure 1C:
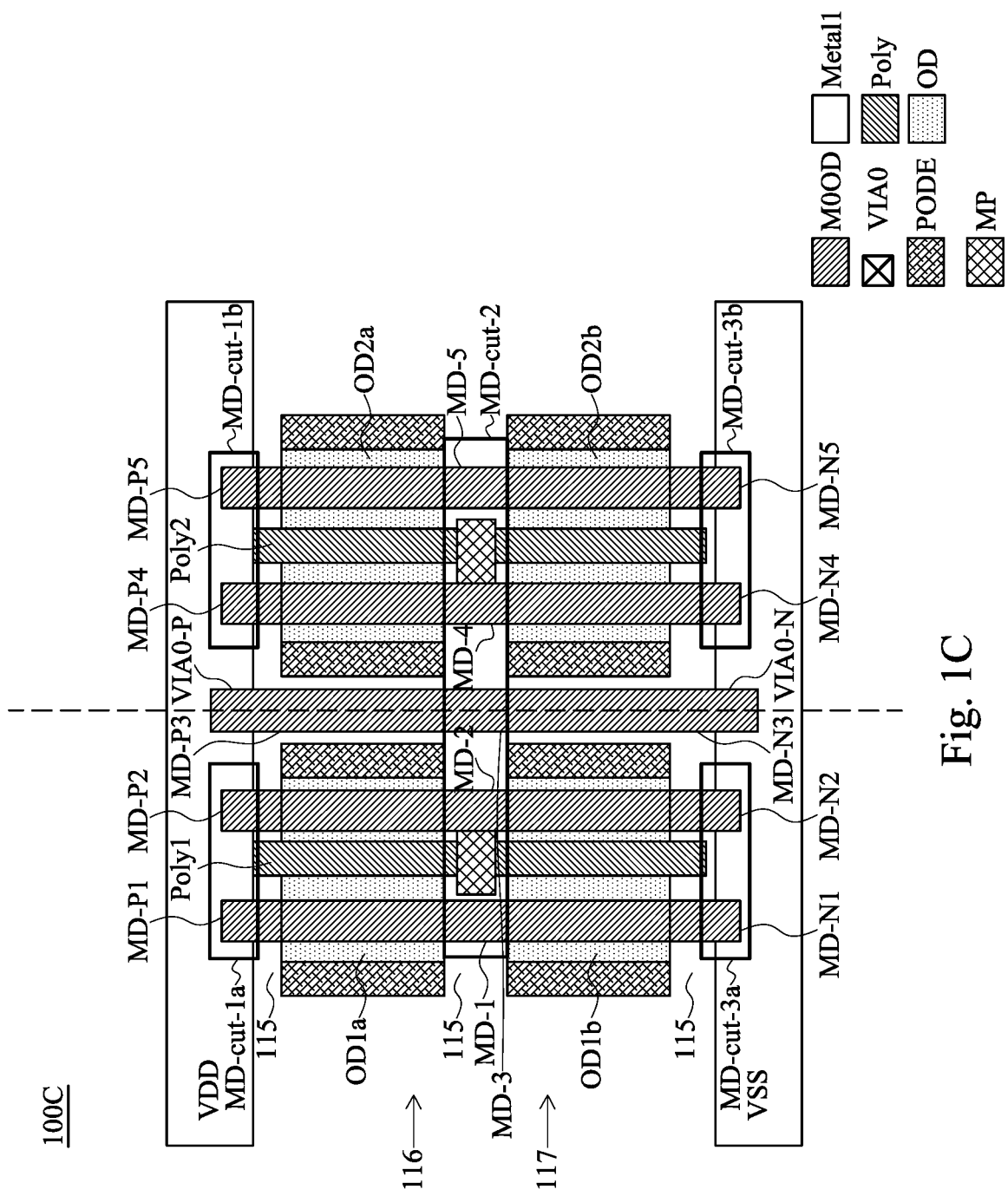
FIG. 1C is a layout of an ECO cell in an unprogrammed state, in accordance with some embodiments.

In some embodiments, the MD patterns in the layout of an ECO cell extend continuously across the isolation structure between rows of OD patterns. For example, as shown in FIG. 1C, which is a layout 100C of an ECO cell in an unprogrammed state in accordance with some embodiments, the conductive pattern MD-P1 is continuous with the conductive pattern MD-N1 to define a continuous MD pattern MD-1 extending continuously over the first active area pattern OD1a and the third active area pattern OD1b. Similarly, the conductive pattern MD-P2 is continuous with the conductive pattern MD-N2, the conductive pattern MD-P3 is continuous with the conductive pattern MD-N3, the conductive pattern MD-P4 is continuous with the conductive pattern MD-N4, and the conductive pattern MD-P5 is continuous with the conductive pattern MD-N5 to define continuous MD patterns MD-2, MD-3, MD-4, and MD-5, respectively. The layout 100 of the ECO cell further includes a mask, referred to herein as "MDcut mask," with a mask section MD-cut-2 for removing portions of the continuous MD patterns MD-1 to MD-5 that extend over the isolation structure 115 between the first row 116 and the second row 117. As a result, when the layout 100C is used to manufacture an IC having an ECO cell according to the layout 100C, the manufactured ECO cell will still have the structure as described with respect to FIG. 1A. In at least one embodiment, the continuous MD patterns MD-1 to MD-5 further overlap the power line VDD and/or ground line VSS. For example, the continuous MD patterns MD-1 and MD-2 further extend to overlap the power line VDD and/or the ground line VSS. The MDcut mask further includes mask sections MD-cut-1a and MD-cut-3a for removing overlapping portions of the continuous MD patterns MD-1 and MD-2 with the power line VDD and ground line VSS. Similarly, the continuous MD patterns MD-4 and MD-5 further extend to overlap the power line VDD and/or the ground line VSS. The MDcut mask further includes mask sections MD-cut-1b and MD-cut-3b for removing overlapping portions of the continuous MD patterns MD-4 and MD-5 with the power line VDD and ground line VSS. The formation of continuous MD patterns extending across multiple rows of active area patterns and the subsequent removal of the MD pattern portions between the rows or overlapping the power line VDD or ground line VSS provide higher manufacturing yield than when MD patterns are directly manufactured in the form shown and described with respect to FIG. 1A. In at least one embodiment, the formation of an ECO cell using the layout 100C permits the corresponding conductive patterns MD-P and MD-N, e.g., the conductive patterns MD-P1 and MD-N1, to be formed at a closer spacing in between than when the layout 100 is used.

In some embodiments, the layout 100 (or 100C) is provided, e.g., as a set of masks, in a standard cell library stored in a non-transitory computer-readable medium. A circuit designer accesses the standard cell library and retrieves the layout 100 (100C) to be placed in the layout of an IC to be designed and manufactured. A semiconductor structure of the manufactured ECO cell in the unprogrammed state has a schematic top view as described with respect to FIG. 1A. A schematic cross-sectional view of a portion of the semiconductor structure of the manufactured ECO cell in the unprogrammed is showed in FIG. 1B, in accordance with some embodiments.

A semiconductor structure 120 in FIG. 1B includes the PMOS P1 formed over the first active area pattern OD1a. The first active area pattern OD1a is formed over a semiconductor substrate 121, and includes a source region 122, a drain region 123, and a channel region 124 between the source region 122 and drain region 123. A gate 125 is formed over the channel region 124. The gate 125 is defined by the first gate pattern Poly1. The source region 122, the drain region 123, the channel region 124 and the gate 125 together define an active device, i.e., the PMOS P1. In at least one embodiment, spacers 126, 127 are formed on opposite sides of the gate 125. A dielectric layer 128 is formed over the active device and the spacers 126, 127.

Conductive patterns are formed above the active device to provide electrical connections to the active device. Specifically, the conductive pattern MP1, i.e., an MP pattern, is formed in the dielectric layer 128 to provide electrical connection to the gate 125. Specifically, the conductive pattern MP1 is disposed above and in electrical contact with the first gate pattern Poly1 defining the gate 125. The conductive patterns MD-P1 (not shown in FIG. 1B) and MD-P2, i.e., MD patterns, are formed in the dielectric layer 128 to provide electrical connections to the corresponding source region 122 and drain region 123. In at least one embodiment, the MD patterns are formed in two steps, including a first step of forming a lower portion of the MD patterns co-elevational with the gate 125, and a second step of forming an upper portion of the MD patterns, together with the MP patterns, and above the gate 125. In at least one embodiment, the MD patterns are formed in one step. Both the MP patterns and the MD patterns belong to the M0 layer. The layout 100 includes one or more masks for forming the MP patterns and the MD patterns in the M0 layer.

A dielectric layer 129 is formed over the dielectric layer 128 with the MP and MD patterns formed therein. One or more vias are formed in the dielectric layer 129 to provide electrical connections to the MP and MD patterns, and then to the active device. For example, the first via VIA0-P is formed in the dielectric layer 129 to provide electrical connection to the underlying first central conductive pattern MD-P3 (not shown in FIG. 1B). The first central conductive pattern MD-P3 is not electrically connected to the MP and MD patterns corresponding to the active device when the ECO cell is in the unprogrammed state. The M1 layer is formed over the dielectric layer 129 with one or more vias formed therein. The M1 layer includes the power line VDD and ground line VSS (not shown in FIG. 1B).

FIG. 2A is a layout 200 of the ECO cell of FIG. 1A in a programmed state, in accordance with some embodiments. In the example illustrated in FIG. 2A, the ECO cell is programmed as an inverter. However, the ECO cell is programmable to perform other functions in various embodiments. In some embodiments, more than one ECO cells are connected and programmed together to define more complex circuitry.

The inverter in the programmed ECO cell includes a PMOS transistor P1 formed in the first active area pattern OD1a and an NMOS transistor N1 formed in the third active area pattern OD1b. The gates of the PMOS transistor P1 and NMOS transistor N1 are connected together and define an input of the inverter. The source region of the PMOS transistor P1 and the drain region of the NMOS transistor N1 are electrically connected together and define an output of the inverter. The source region of the NMOS transistor N1 is electrically connected to ground line VSS, and the drain region of the PMOS transistor P1 is electrically connected to the power line VDD to provide power to the inverter in operation.

The above-described electrical connections are provide by modifying the M1 layer to include a plurality of connection patterns 201~204, and the VIA0 layer to include a plurality of vias 211~217. Specifically, the gates of the PMOS transistor P1 and NMOS transistor N1 are defined by the first gate pattern Poly1, and are already connected with each other. The via 213 is formed above and in electrical contact with the conductive pattern MP1 which, in turn, is in electrical contact with the first gate pattern Poly1. The connection pattern 203 is formed above and in electrical contact with the via 213. The connection pattern 203 defines the input of the inverter. Further routing is formed to electrically connect the connection pattern 203 to outside circuitry.

The source region of the PMOS transistor P1 is electrically connected by the conductive pattern MD-P1, the via 211, the connection pattern 201, the via 212 and the conductive pattern MD-N1 to the drain region of the NMOS transistor N1. The via 211 is formed above and in electrical contact with the conductive pattern MD-P1, the via 212 is formed above and in electrical contact with the conductive pattern MD-N1, and the connection pattern 201 is formed above and in electrical contact with both the via 211 and the via 212. The connection pattern 201 defines the output of the inverter. Further routing is formed to electrically connect the connection pattern 201 to outside circuitry.

The source region of the NMOS transistor N1 is electrically connected by the conductive pattern MD-N2, the via 217, the connection pattern 204, the via 216, the second central conductive pattern MD-N3 and the second via VIA0-N to the ground line VSS. The via 217 is formed above and in electrical contact with the conductive pattern MD-N2, the via 216 is formed above and in electrical contact with the second central conductive pattern MD-N3, and the connection pattern 204 is formed above and in electrical contact with both the via 216 and the via 217.

The drain region of the PMOS transistor P1 is electrically connected by the conductive pattern MD-P2, the via 215, the connection pattern 202, the via 214, the first central conductive pattern MD-P3 and the first via VIA0-P to the power line VDD. The via 215 is formed above and in electrical contact with the conductive pattern MD-P2, the via 214 is formed above and in electrical contact with the first central conductive pattern MD-P3, and the connection pattern 202 is formed above and in electrical contact with both the via 214 and the via 215.

In the example illustrated in FIG. 2A, the first 1P1N structure 118 of the ECO cell is programmed to define an inverter, whereas the second 1P1N structure 119 remains unused while occupying a chip area in the IC to be manufactured. However, such a loss of useful chip area is tolerable given that all ECO cells in an IC occupy a small area of about 5-10 percent of the total chip area.

FIG. 2B is a schematic cross-sectional view of a portion of a semiconductor structure 220 of the programmed ECO cell of FIG. 2A. The semiconductor structure 220 in FIG. 2B includes the PMOS transistor P1 formed over the first active area pattern OD1a. Compared to the semiconductor structure 120 in FIG. 1B, the semiconductor structure 220 additionally includes the vias 213 and 215 in the VIA0 layer, and the connection patterns 202, 203 in the M1 layer. The via 213 and the connection pattern 203 provide electrical connection to the gate 125 through the conductive pattern MP1. The via 215 and the connection pattern 202 provide power from the power line VDD to drain region drain region 123 of the PMOS transistor P1 through the conductive pattern MD-P2 on one side, and through the first via VIA0-P, the first central conductive pattern MD-P3 and the via 214 on the other side.

By modifying only two layers, i.e., the M1 layer and the VIA0 layer, it is possible in some embodiments to program one or more ECO cells to provide a specific function.

Figure 3A:
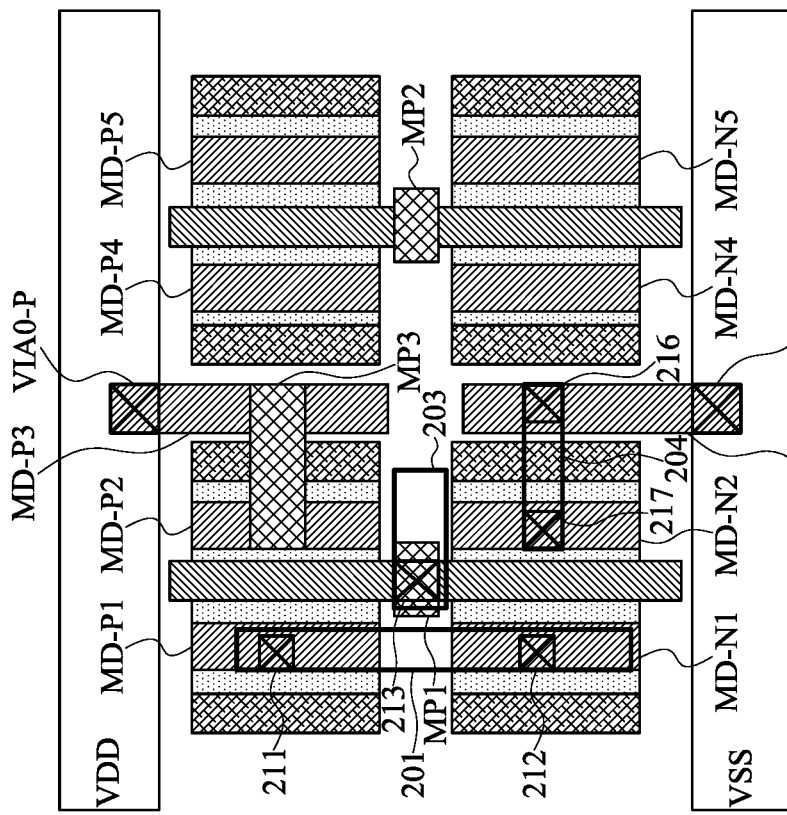
FIG. 3A is a layout of the ECO cell of FIG. 1A in a programmed state, in accordance with some embodiments.

FIG. 3A is a layout 300 of the ECO cell of FIG. 1A in a programmed state, in accordance with some embodiments. In the example illustrated in FIG. 3A, the ECO cell is programmed as an inverter with the electrical connections as described with respect to FIG. 2A. A difference between the layout 300 and the layout 200 is the replacement of the vias 214, 215 and the connection pattern 202 in the layout 200 of FIG. 2A with a conductive pattern MP3 in layout 300 of FIG. 3A. The conductive pattern MP3 is an MP pattern which belongs to the M0 layer. The conductive pattern MP3 electrically connects the conductive pattern MD-P2 to the first central conductive pattern MD-P3. Similarly, an MP pattern (not shown), which belongs to the M0 layer, electrically connects the conductive pattern MD-N2 to the second central conductive pattern MD-N3

Figure 3B:
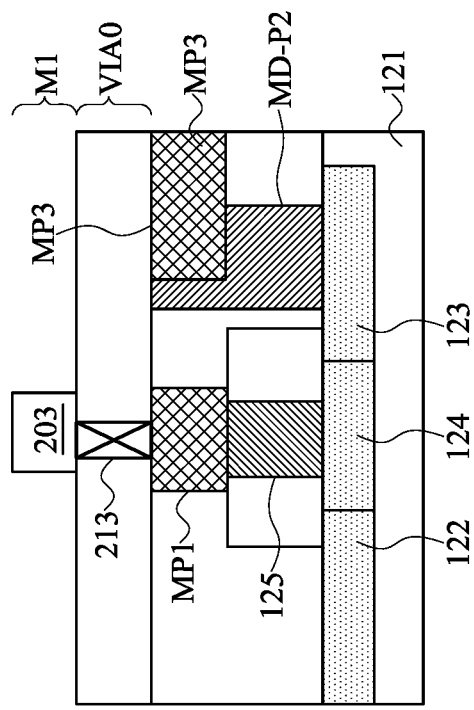
FIG. 3B is a schematic cross-sectional view of a portion of a semiconductor structure of the ECO cell in the programmed state of FIG. 3A, in accordance with some embodiments.

FIG. 3B is a schematic cross-sectional view of a portion of a semiconductor structure 320 of the programmed ECO cell of FIG. 3A. The semiconductor structure 320 includes the conductive pattern MP3 extending from the upper portion of the conductive pattern MD-P2 outwardly to come into electrical connection with the first central conductive pattern MD-P3 (not shown in FIG. 3B).

The programming of the ECO cell in accordance with the layout 300 includes modifying not only the M1 layer and VIA0 layer, but also the MP patterns in the M0 layer. Compared to the programming of the ECO cell in accordance with the layout 200, the layout 300 includes modifications of an additional mask, i.e., the mask for forming the MP patterns in the M0 layer. However, in some embodiments, it is useful to modify an additional layer, such as the M0 layer. For example, when the M1 layer and/or the VIA0 layer is/are so crowded that the addition of vias, such as the vias 214, 215, and/or connection patterns, such as the connection pattern 202, would run the risk of causing the layout to fail a design rule, such a risk is avoidable by modifying the M0 layer to provide electrical connections that would otherwise be included in the crowded M1 layer and/or VIA0 layer.

Figure 4A:
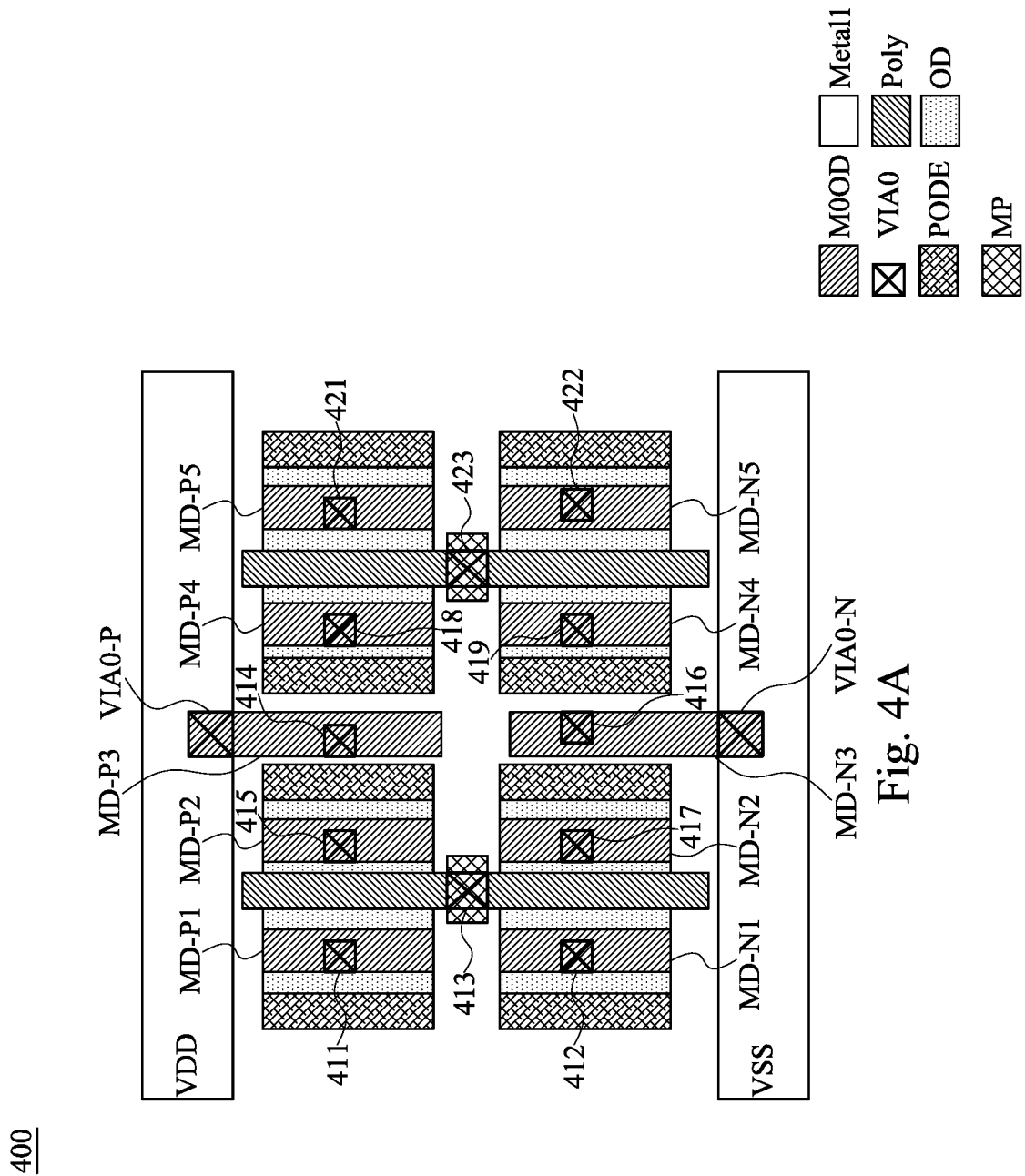
FIG. 4A is a layout of an ECO cell in an unprogrammed state, in accordance with some embodiments.

FIG. 4A is a layout 400 of an ECO cell in an unprogrammed state, in accordance with some embodiments. Compared to the layout 100, the layout 400 additionally includes a plurality of vias 411, 412, 413, 414-419, 421, 422 and 423 each formed on one of the MD patterns. When an ECO cell is manufactured in accordance with the layout 400, the vias 411, 412, 413, 414-419, 421, 422 and 423 are included in the manufactured ECO cell, regardless of whether the vias will be used for forming electrical connections to the ECO cell.

Figure 4B:
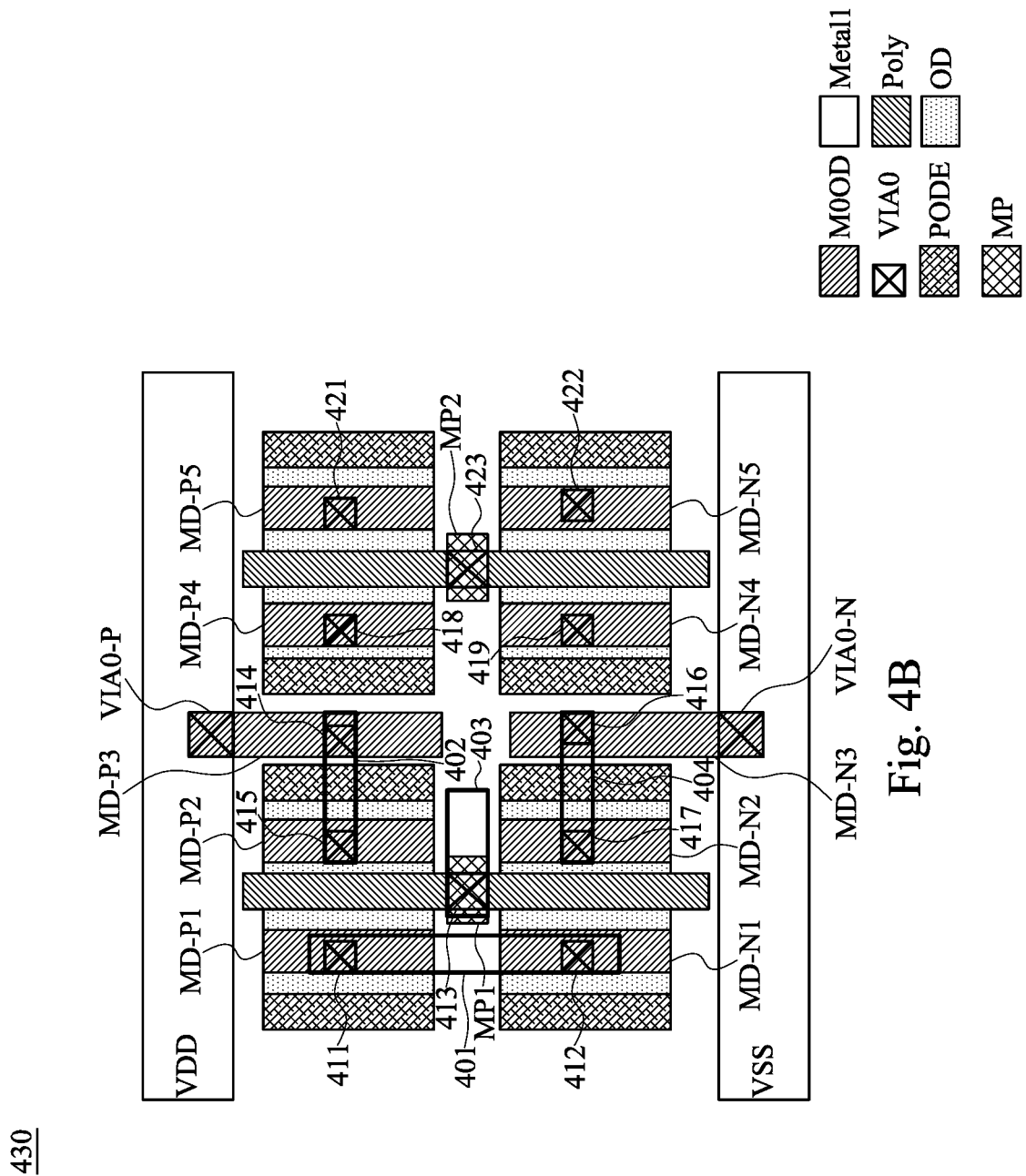
FIG. 4B is a layout of the ECO cell of FIG. 4A in a programmed state, in accordance with some embodiments.

FIG. 4B is a layout 430 of the ECO cell of FIG. 4A in a programmed state, in accordance with some embodiments. In the example illustrated in FIG. 4B, the ECO cell is programmed as an inverter with the electrical connections as described with respect to FIG. 2A. Specifically, the electrical connections in the layout 430 in FIG. 4B are defined by a plurality of connection patterns 401~404 in the M1 layer, and the vias 411~417 in the VIA0 layer. The connection patterns 401~404 and the vias 411~417 in the layout 430 correspond to the connection patterns 201~204 and the vias 211~217 in the layout 200.

In some embodiments, because all of the VIA0 layer vias for making electrical connections to the programmed ECO cell are pre-designed in the layout 400 of the unprogrammed ECO cell, the programming of the ECO cell according to the layout 430 involves only modifying the M1 layer to include the connection patterns 401~404, which reduces the design revision time and cost. However, the pre-designed vias 411~417 have affixed positions which limit flexibility in placing and/or routing the connection patterns 401~404. Such a limited flexibility is less likely a concern when the VIA0 layer vias (except for the first via VIA0-P and the second via VIA0-N) for making electrical connections to the programmed ECO cell are not pre-designed, as described with respect to the layout 100. In some embodiments, various types of ECO cell layouts (such as the layout 100 and layout 400) are provided in standard cell libraries to permit the circuit designer to select an ECO cell layout based on his or her design considerations. For example, the layout 100 is selected when design flexibility is a consideration, whereas the layout 400 is selected when the design revision time and/or cost is a consideration.

Figure 5:
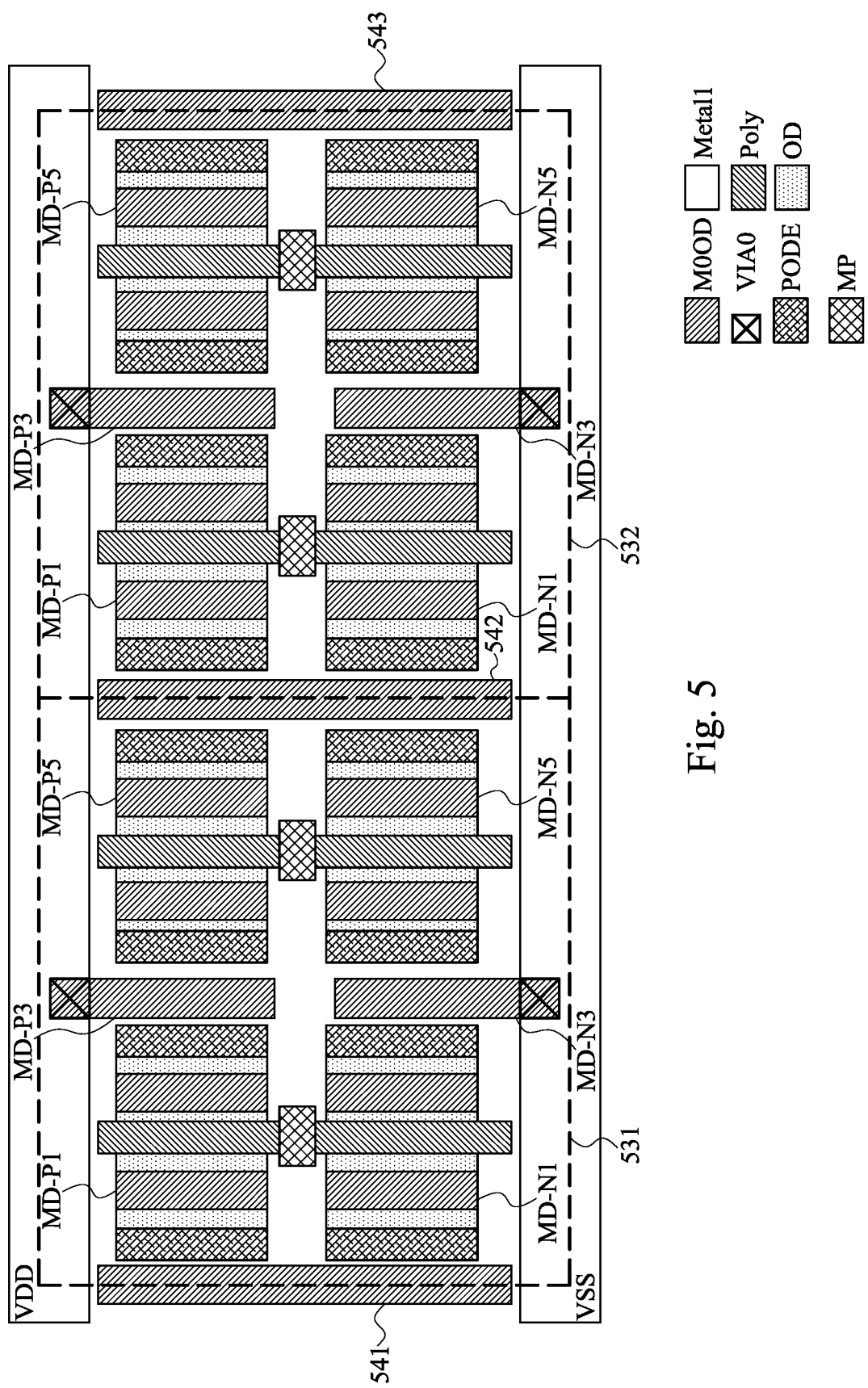
FIG. 5 is a layout of a portion of an array of ECO cells, in accordance with some embodiments.

FIG. 5 is a layout of a portion of an array 500 of ECO cells, in accordance with some embodiments. The array 500 includes a plurality of ECO cells arranged side-by-side in one or more rows and/or one or more columns. FIG. 5 shows two adjacent ECO cells 531, 532 in the unprogrammed state. The ECO cells 531, 532 have the same layout, such as the layout 100 described with respect to FIG. 1A. The array 500 further includes a plurality of additional MD patterns 541, 542, 543 formed on the boundaries between adjacent ECO cells. In some embodiments, the additional MD patterns 541, 542, 543 are used to program one or more of the ECO cells in the array 500, and/or to route one or more of the programmed ECO cells in the array 500 to outside circuitry.

Figure 6:
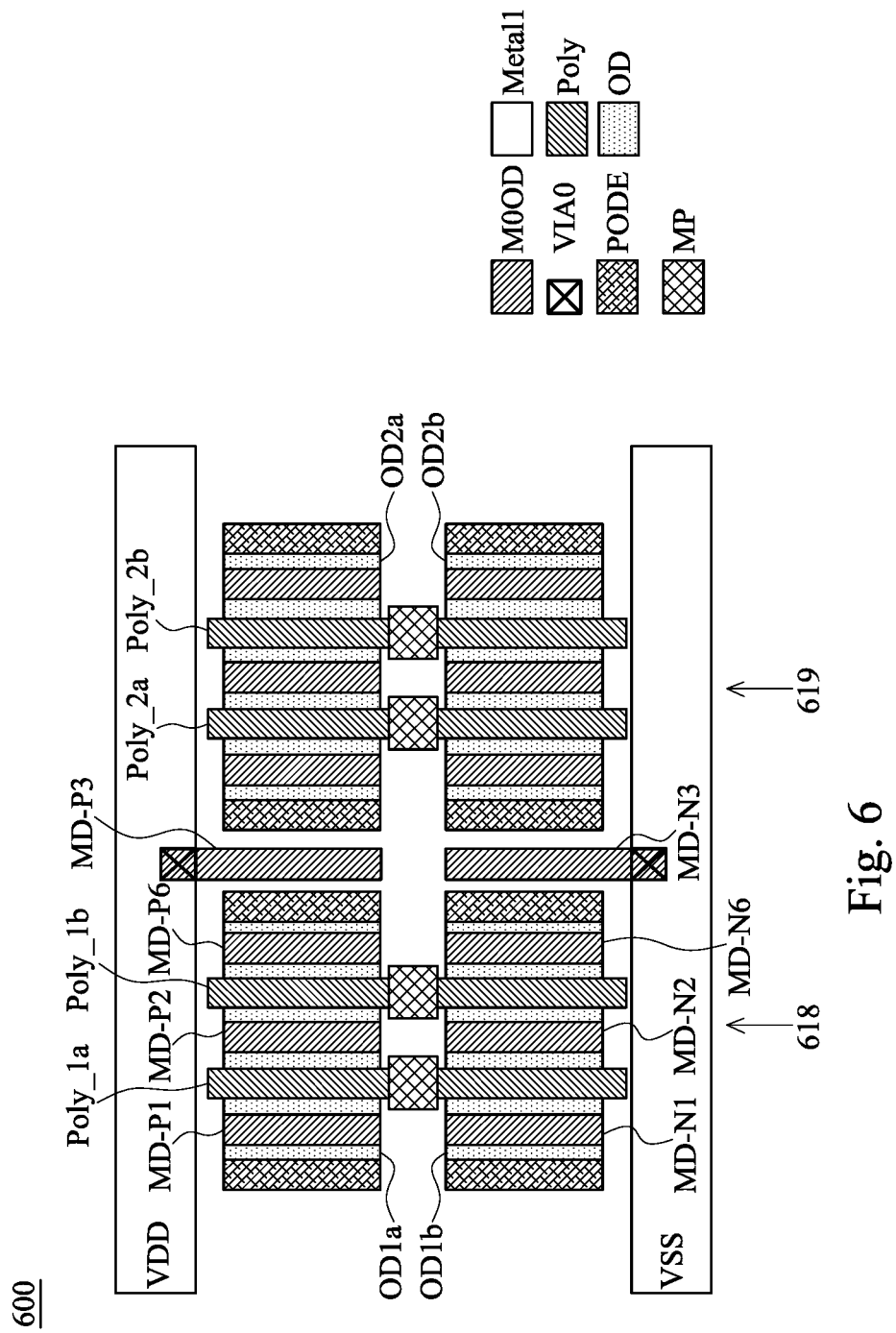
FIG. 6 is a layout of an ECO cell in an unprogrammed state, in accordance with some embodiments.

FIG. 6 is a layout 600 of an ECO cell in an unprogrammed state, in accordance with some embodiments. Compared to the layout 100 which has a dual 1P1N structure, the layout 600 has a dual 2P2N structure. Specifically, there are two Poly patterns formed over each of the OD pattern in the layout 600. For example, two gate patterns Poly_1a and Poly_1b are formed over each of the first active area pattern OD1a and third active area pattern OD1b. Similarly, two gate patterns Poly_2a and Poly_2b are formed over each of the second active area pattern OD2a and the fourth active area pattern OD2b. In addition, three MD patterns (rather than two MD patterns as in the layout 100) are formed over each of the OD patterns in an alternating arrangement with respect to the Poly patterns. For example, three conductive patterns MD-P1, MD-P2 and MD-P6 are alternatingly arranged with respect to two gate patterns Poly_1a and Poly_1b over the first active area pattern OD1a. Similarly, three conductive patterns MD-N1, MD-N2 and MD-N6 are alternatingly arranged with respect to two gate patterns Poly_1a and Poly_1b over the third active area pattern OD1b. As a result, two NMOS transistors are formed in the first active area pattern OD1a and two PMOS transistors are formed in the third active area pattern OD1b. The two PMOS transistors and two NMOS transistors together define a first 2P2N structure 618. A second 2P2N structure 619 is formed in the second active area pattern OD2a and the fourth active area pattern OD2b, and is symmetric with respect to the first 2P2N structure across the central MD patterns MD-P3, MD-N3.

Figure 7A:
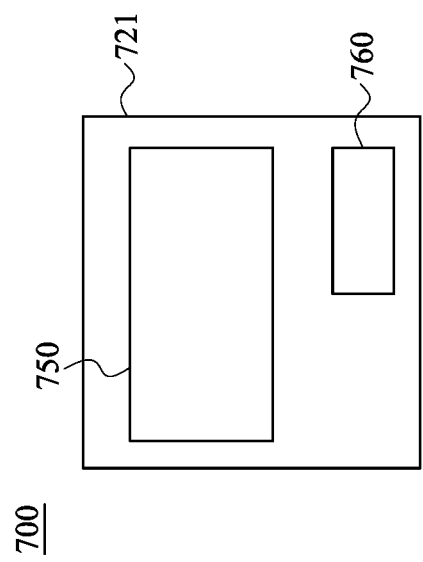
FIG. 7A is a schematic view of a semiconductor device, in accordance with some embodiments.
Figure 7B:
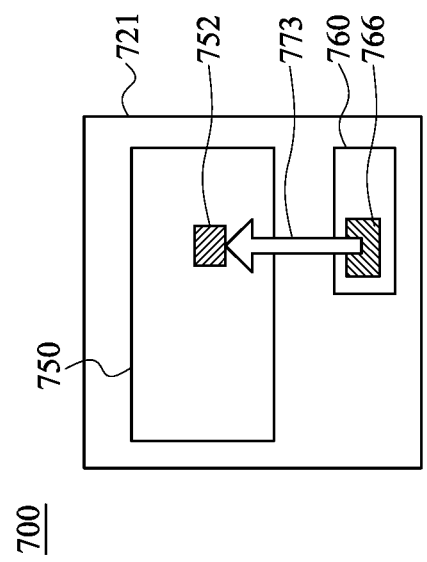
FIG. 7B is a schematic view of the semiconductor device of FIG. 7A revised with one or more programmed ECO cells, in accordance with some embodiments

FIG. 7A is a schematic view of a semiconductor device 700, in accordance with some embodiments. FIG. 7B is a schematic view of the semiconductor device 700 with one or more programmed ECO cells, in accordance with some embodiments. FIG. 8 is a flow chart of a method 800 of designing or manufacturing a semiconductor device, in accordance with some embodiments. The following description of the method of FIG. 8 will be made with reference to FIGS. 7A and 7B.

At operation 805, a semiconductor device is designed or manufactured. For example, a semiconductor device 700 as shown in FIG. 7A is designed or manufactured. The semiconductor device 700 includes an IC formed on a substrate 721. The IC includes a functional circuit 750 and an array 760 of ECO cells. The functional circuit 750 is configured to provide a functionality of the IC. In at least one embodiment, the functional circuit 750 includes one or more functional cells having pre-designed layouts provided in standard cell libraries. In at least one embodiment, the array 760 includes a plurality of ECO cells, as described with respect to FIG. 5. The ECO cells have one or more pre-designed layouts, as described with respect to FIGS. 1A, 4A and 6. In an initial design of the IC, the ECO cells are unprogrammed and/or not connected (or routed) to the functional circuit 750.

At operation 815, a functional circuit of the designed or manufactured semiconductor device is tested. For example, in at least one embodiment, the functional circuit 750 of the semiconductor device 700 is tested, e.g., by one or more simulations, and checked against a plurality of design rules and/or the intended specification of the IC. In at least one embodiment, a test IC is manufactured based on the initial design and then the manufactured IC is tested. Based on test results of the designed and/or the manufactured IC, a determination is made as to whether the design is to be revised.

At operation 825, if the test results indicate that the design is to be revised, one or more ECO cells in the IC are programmed and routed to the functional circuit. For example, if the design is to be revised to replace a failed circuit 752 (shown in FIG. 7B), one or more ECO cells 766 in the array 760 is/are programmed to provide the function of the failed circuit 752. Routing 773 is then performed to electrically connect the programmed ECO cells 766 to the functional circuit 750 for replacing the failed circuit 752. In at least one embodiment, ECO cells in the array 760 are programmed and routed to modify, rather than replace, a circuit (which is not necessarily failed) in the functional circuit 750. In at least one embodiment, ECO cells in the array 760 are programmed and routed to add a new circuit to the functional circuit 750. In some embodiments, the revised design of the IC and/or an IC manufactured based on the revised design are tested to determine whether further revisions are to be made. In at least one embodiment, the process repeats until determination is made that the IC is to be re-designed or that the revised design of the IC is satisfactory for mass manufacture.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, one or more operations of the method 800 is/are performed by one or more computer systems. For example, one or more of the operations of designing an IC, simulating a design of the IC, programming ECO cells, and routing the programmed ECO cells to a functional circuit of the IC are performed by one or more computer systems.

FIG. 9 is a block diagram of a computer system 900, in accordance with some embodiments. The computer system 900 comprises a processor 901, a memory 902, a network interface (I/F) 906, a storage 310, an input/output (I/O) device 908, and one or more hardware components 918 communicatively coupled via a bus 904 or other interconnection communication mechanism.

The memory 902 comprises, in some embodiments, a random access memory (RAM) and/or other dynamic storage device and/or read only memory (ROM) and/or other static storage device, coupled to the bus 904 for storing data and/or instructions to be executed by the processor 901, e.g., kernel 914, userspace 916, portions of the kernel and/or the userspace, and components thereof. The memory 902 is also used, in some embodiments, for storing temporary variables or other intermediate information during execution of instructions to be executed by the processor 901.

In some embodiments, a storage device 910, such as a magnetic disk or optical disk, is coupled to the bus 904 for storing data and/or instructions, e.g., kernel 914, userspace 916, etc. The I/O device 908 comprises an input device, an output device and/or a combined input/output device for enabling user interaction with the system 900. An input device comprises, for example, a keyboard, keypad, mouse, trackball, trackpad, and/or cursor direction keys for communicating information and commands to the processor 901. An output device comprises, for example, a display, a printer, a voice synthesizer, etc. for communicating information to a user.

In some embodiments, the processes or functionality described herein are realized by a processor, e.g., the processor 901, which is programmed for performing such processes. One or more of the memory 902, the OF 906, the storage 310, the I/O device 908, the hardware components 918, and the bus 904 is/are operable to receive instructions, data, design rules and/or other parameters for processing by the processor 901. For example, various layouts of ECO cells are provided in a standard cell library stored in a non-transitory computer-readable medium, such as the storage device 910, for access by the processor 901. In some embodiments, one or more of the processes or functionality is/are performed by specifically configured hardware (e.g., by one or more application specific integrated circuits or ASIC(s)) which is/are included) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

One aspect of this description relates to a semiconductor device, comprising an array of Engineering Change Order (ECO) cells. Each of the ECO cells in the array includes a first metal pattern and a second metal pattern. Each of the ECO cells in the array further includes a plurality of active area patterns isolated from each other and arranged between the first and second metal patterns. Each of the ECO cells in the array further includes a first central metal pattern overlapping the first metal pattern. Each of the ECO cells in the array further includes a via electrically connecting the first central metal pattern to the first metal pattern. The plurality of active area patterns is arranged symmetrically about the first central metal pattern. In some embodiments, for each of the ECO cells, a second central metal pattern is aligned with the first central metal pattern and overlapping the second metal pattern. The plurality of active area patterns is arranged symmetrically about the second central metal pattern. In some embodiments, each of the plurality of active area patterns in each of the ECO cells includes at least one polysilicon pattern overlapping a first active area pattern of the plurality of active area patterns; and two additional metal patterns overlapping the first active area pattern and arranged on opposite sides of the corresponding at least one polysilicon pattern. The additional metal patterns and the first and second central metal patterns belong to a first metal layer. The first and second metal patterns belong to a second metal layer above the first metal layer. In some embodiments, for each of the ECO cells, a second via electrically connects the second central metal pattern with the second metal pattern. In some embodiments, at least one of the ECO cells is in an unprogrammed state in which the polysilicon patterns and the two additional metal patterns are electrically isolated from the first and second metal patterns and from the first central metal pattern. In some embodiments, at least one of the ECO cells is in a programmed state in which at least one of the polysilicon patterns or at least one of the two additional metal patterns is electrically connected with at least one of the first metal pattern or the second metal patterns and the first central metal pattern.

Another aspect of this description relates to a method. The method includes designing or manufacturing a semiconductor device. The semiconductor device includes a functional circuit, and an Engineering Change Order (ECO) cell in an unprogrammed state. The ECO cell includes a plurality of transistors arranged symmetrically about a symmetrical axis, and first and second central metal patterns along the symmetrical axis, the first and second central metal patterns overlapping and electrically connected with a power line and a ground line, respectively. The method further includes testing the functional circuit. The method further includes programming, based on a result of the testing, the ECO cell. The method further includes routing the programmed ECO cell to the functional circuit. In some embodiments, the programming includes modifying, in the semiconductor device, only a metal layer immediately above and electrically connected with a lowermost via layer above the transistors. In some embodiments, the programming includes modifying, in the semiconductor device, only a lowermost via layer above the transistors and a metal layer immediately above and electrically connected with the lowermost via layer. In some embodiments, the programming includes modifying, in the semiconductor device, only a lowermost via layer above the transistors, a metal layer immediately above and electrically connected with the lowermost via layer, and a metal-over-polysilicon layer immediately above and electrically connected with gates of the transistors.

Still another aspect of this description relates to a method. The method includes manufacturing a semiconductor device. The semiconductor device includes a functional circuit. The semiconductor device further includes a plurality of Engineering Change Order (ECO) cells electrically separated from the functional circuit. Each ECO cell of the plurality of ECO cells includes a plurality of transistors arranged symmetrically about a symmetrical axis, a first central metal pattern along the symmetrical axis, wherein the first central metal pattern is electrically connected to a power line, and a second central metal pattern along the symmetrical axis, wherein the second central metal pattern is electrically connected to a ground line. The method further includes testing the functional circuit. The method further includes electrically connecting at least one ECO cell of the plurality of ECO cells to the functional circuit based on results of the testing. In some embodiments, the electrically connecting of the at least one ECO cell to the functional circuit includes modifying a via layer closest to the plurality of transistors, a metal layer immediately above the via layer, and a metal-over-polysilicon layer immediately above the plurality of transistors. In some embodiments, the electrically connecting the at least one ECO cell to the functional circuit includes replacing a faulty portion of the functional circuit with the at least one ECO cell. In some embodiments, the electrically connecting the at least one ECO cell to the functional circuit includes modifying functional of a portion of the functional circuit using the at least one ECO cell. In some embodiments, the electrically connecting the at least one ECO cell to the functional circuit includes adding a new functionality to the functional circuit using the at least one ECO cell. In some embodiments, the electrically connecting the at least one ECO cell to the functional circuit includes electrically connecting multiple ECO cells of the plurality of ECO cells to the functional circuit. In some embodiments, the method further includes retesting the functional circuit following the electrically connecting the at least one ECO cell to the functional circuit. In some embodiments, the method further includes electrically connecting a second ECO cell of the plurality of ECO cells to the functional circuit in response to results of the retesting of the functional circuit. In some embodiments, the electrically connecting the at least one ECO cell to the functional circuit includes electrically connecting the at least one of the first central metal pattern or the second central metal pattern to a conductive pattern within the at least one ECO cell. In some embodiments, the electrically connecting the at least one ECO cell to the functional circuit includes electrically connecting a first ECO cell of the plurality of ECO cells to the functional circuit, wherein the first ECO cell is electrically connected to a second ECO cell of the plurality of ECO cells prior to the electrically connecting the at least one ECO cell to the functional circuit.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising an array of Engineering Change Order (ECO) cells, each of the ECO cells in the array comprising:
   a first metal pattern;
   a second metal pattern;
   a plurality of active area patterns isolated from each other and arranged between the first and second metal patterns, wherein the plurality of active area patterns is spaced from the first metal pattern and the second metal pattern in a plan view; and
   a first central metal pattern overlapping the first metal pattern; and
   a via electrically connecting the first central metal pattern to the first metal pattern,
   wherein the plurality of active area patterns is arranged symmetrically about the first central metal pattern
   for each of the plurality of active area patterns in each of the ECO cells,
      at least one polysilicon pattern overlapping a first active area pattern of the plurality of active area patterns; and
      two additional metal patterns overlapping the first active area pattern and arranged on opposite sides of the corresponding at least one polysilicon pattern,
      wherein
      the additional metal patterns and the first and second central metal patterns belong to a first metal layer, and
      the first and second metal patterns belong to a second metal layer above the first metal layer.

2. The semiconductor device of claim 1, further comprising, for each of the ECO cells,
   a second central metal pattern aligned with the first central metal pattern and overlapping the second metal pattern, wherein the plurality of active area patterns is arranged symmetrically about the second central metal pattern.

3. The semiconductor device of claim 2, further comprising, for each of the ECO cells,
   a second via electrically connecting the second central metal pattern with the second metal pattern.

4. The semiconductor device of claim 1, wherein at least one of the ECO cells is in an unprogrammed state in which the polysilicon patterns and the two additional metal patterns are electrically isolated from the first and second metal patterns and from the first central metal pattern.

5. The semiconductor device of claim 1, wherein at least one of the ECO cells is in a programmed state in which at least one of the polysilicon patterns or at least one of the two additional metal patterns is electrically connected with at least one of the first metal pattern or the second metal patterns and the first central metal pattern.

6. A method, comprising:
designing or manufacturing a semiconductor device, the semiconductor device comprising:
a functional circuit, and
an Engineering Change Order (ECO) cell in an unprogrammed state, the ECO cell comprising a plurality of transistors arranged symmetrically about a symmetrical axis, and first and second central metal patterns along the symmetrical axis, the first and second central metal patterns overlapping and electrically connected with a power line and a ground line, respectively, at least one polysilicon pattern overlapping a first active area pattern, two additional metal patterns overlapping the first active area pattern and arranged on opposite sides of the corresponding at least one polysilicon pattern, wherein the additional metal patterns and the first and second central metal patterns belong to a first metal layer, and the first and second central metal patterns belong to a second metal layer above the first metal layer;
testing the functional circuit;
programming, based on a result of the testing, the ECO cell; and
routing the programmed ECO cell to the functional circuit.

7. The method of claim 6, wherein the programming comprises
modifying, in the semiconductor device, only a metal layer immediately above and electrically connected with a lowermost via layer above the transistors.

8. The method of claim 6, wherein the programming comprises
modifying, in the semiconductor device, only a lowermost via layer above the transistors and a metal layer immediately above and electrically connected with the lowermost via layer.

9. The method of claim 6, wherein the programming comprises
modifying, in the semiconductor device, only a lowermost via layer above the transistors, a metal layer immediately above and electrically connected with the lowermost via layer, and a metal-over-polysilicon layer immediately above and electrically connected with gates of the transistors.

10. A method, comprising:
manufacturing a semiconductor device, the semiconductor device comprising:
a functional circuit, and
a plurality of Engineering Change Order (ECO) cells electrically separated from the functional circuit, wherein each ECO cell of the plurality of ECO cells comprises:
a plurality of transistors arranged symmetrically about a symmetrical axis,
a first central metal pattern along the symmetrical axis, wherein the first central metal pattern is electrically connected to a power line, and
a second central metal pattern along the symmetrical axis, wherein the second central metal pattern is electrically connected to a ground line;
at least one polysilicon pattern overlapping a first active area pattern; and
two additional metal patterns overlapping the first active area pattern and arranged on opposite sides of the corresponding at least one polysilicon pattern,
wherein
the additional metal patterns and the first and second central metal patterns belong to a first metal layer, and
the first and second central metal patterns belong to a second metal layer above the first metal layer
testing the functional circuit; and
electrically connecting at least one ECO cell of the plurality of ECO cells to the functional circuit based on results of the testing.

11. The method of claim 10, wherein the electrically connecting of the at least one ECO cell to the functional circuit comprises modifying a via layer closest to the plurality of transistors, a metal layer immediately above the via layer, and a metal-over-polysilicon layer immediately above the plurality of transistors.

12. The method of claim 10, wherein the electrically connecting the at least one ECO cell to the functional circuit comprises replacing a faulty portion of the functional circuit with the at least one ECO cell.

13. The method of claim 10, wherein the electrically connecting the at least one ECO cell to the functional circuit comprises modifying functional of a portion of the functional circuit using the at least one ECO cell.

14. The method of claim 10, wherein the electrically connecting the at least one ECO cell to the functional circuit comprises adding a new functionality to the functional circuit using the at least one ECO cell.

15. The method of claim 10, wherein the electrically connecting the at least one ECO cell to the functional circuit comprises electrically connecting multiple ECO cells of the plurality of ECO cells to the functional circuit.

16. The method of claim 10, further comprising retesting the functional circuit following the electrically connecting the at least one ECO cell to the functional circuit.

17. The method of claim 16, further comprising electrically connecting a second ECO cell of the plurality of ECO cells to the functional circuit in response to results of the retesting of the functional circuit.

18. The method of claim 10, wherein the electrically connecting the at least one ECO cell to the functional circuit comprises electrically connecting the at least one of the first central metal pattern or the second central metal pattern to a conductive pattern within the at least one ECO cell.

19. The method of claim 10, wherein the electrically connecting the at least one ECO cell to the functional circuit comprises electrically connecting a first ECO cell of the plurality of ECO cells to the functional circuit, wherein the first ECO cell is electrically connected to a second ECO cell of the plurality of ECO cells prior to the electrically connecting the at least one ECO cell to the functional circuit.

20. The semiconductor device of claim 1, further comprising at least one transistor in each active area pattern of the plurality of active area patterns.

* * * * *